United States Patent
Vo

Patent Number: 5,663,925
Date of Patent: Sep. 2, 1997

[54] METHOD AND APPARATUS FOR TIMING CONTROL IN A MEMORY DEVICE

[75] Inventor: Huy Thanh Vo, Boise, Id.

[73] Assignee: Micron Technology, Inc., Boise, Id.

[21] Appl. No.: 581,472

[22] Filed: Dec. 18, 1995

[51] Int. Cl.$^6$ .............................. G11C 7/00; G11C 8/00
[52] U.S. Cl. ........................ 365/230.05; 365/189.01; 365/189.07
[58] Field of Search .................. 365/230.05, 230.06, 365/189.01, 189.07, 210

[56] References Cited

U.S. PATENT DOCUMENTS

| | | | |
|---|---|---|---|
| 4,322,825 | 3/1982 | Nagami | 365/203 |
| 4,502,140 | 2/1985 | Proebsting | 365/201 |
| 4,947,374 | 8/1990 | Wada et al. | 365/195 |
| 4,998,222 | 3/1991 | Sussman | 365/203 |
| 5,262,984 | 11/1993 | Noguchi et al. | 365/185.03 |
| 5,490,114 | 2/1996 | Butler et al. | 365/189.05 |
| 5,513,143 | 4/1996 | McClure | 365/195 |

Primary Examiner—David C. Nelms
Assistant Examiner—Trong Quang Phan
Attorney, Agent, or Firm—Seed and Berry LLP

[57] ABSTRACT

In a memory device such as a DRAM or multiport DRAM, each of a plurality of memory cells includes an access transistor with a gate connected to a word line and a storage capacitor with a storage node connected through the access transistor to a digit line. Data is transferred on the digit line to and from the storage capacitor when the word line is activated and the access transistor enabled thereby. According to the present invention, a timing control circuit is provided to control deactivation of the word line. The timing control circuit includes a digit-write/transfer model that simulates a read-write cycle in a DRAM or a serial write transfer operation in a multiport DRAM. The digit-write transfer model produces an output signal indicating the state of the modeled data transfer operation. The timing control circuit also includes a reference voltage circuit and a level comparator. The level comparator compares the model output signal to the reference voltage provided by the reference voltage circuit. The level comparator includes a sensitive analog multi-stage current mirror differential amplifier circuit and produces a signal input to a RAS timing chain circuit which deactivates the word line upon completion of the modeled data transfer operation.

13 Claims, 4 Drawing Sheets

METHOD AND APPARATUS FOR TIMING CONTROL IN A MEMORY DEVICE

TECHNICAL FIELD

This invention relates generally to electronic memory devices, and more particularly to circuits and methods for controlling timing of data transfer to and within such memory devices.

BACKGROUND OF THE INVENTION

Computer designers are always searching for faster memory devices that will allow them to design faster computers. A significant limitation on a computer's operating speed is the time required to transfer data between a processor and a memory circuit, such as a read or write data transfer. Memory circuits, such as a dynamic random access memories (DRAMs), usually include a large number of memory cells arranged in one or more arrays, each having rows and columns. The memory cells provide locations at which the processor can store and retrieve data. The more quickly the processor can store and retrieve data, the more quickly it can perform a calculation or execute a program using the data.

Multiport DRAMs, such as VRAMs (video random access memories), may also include a serial access memory (SAM) which permits rapid serial access to blocks of stored data. This can be particularly convenient in video applications where address sequences are often predetermined. Data is often transferred between the SAM memory cells and DRAM memory cells. FIG. 1 depicts a portion of a typical prior art multiport DRAM 10. A DRAM memory cell 12 is connected to a column or digit line D and a row or word line W. A complimentary digit line D* connects to other DRAM memory cells (not shown) that are accessed by other word lines (not shown). A SAM memory cell 14 is connected to a transfer digit line TD and to a complementary transfer digit line TD*.

Transfer transistors 18 receive a gate signal TRAN and control transfer operations between the SAM cell 14 and the digit lines D and D*. Isolation transistors 20 receive a gate signal ISO and control connection of the digit lines D and D* to sense amp circuitry 16 which senses and amplifies the voltage between the digit line pair D and D*. Access between the sense amp circuitry 16 and a DRAM I/O path I/O, I/O* is controlled by column select transistors 24 which receive a gate signal CS. Access between the SAM cell 14 and a SAM I/O path SI/O, SI/O* is controlled by column select transistors 26 which receive a gate signal SCS. When the DRAM cell 12 is not being accessed, equalization circuitry 22 provides a precharged and equalized potential of $V_{cc}/2$ (where $V_{cc}$ is the supply voltage) to the digit line pair D and D* in response to a signal EQ. A similar transfer equalization circuit (not shown) provides a precharged and equalized potential of $V_{cc}/2$ to the transfer digit line pair TD and TD*. The supply voltage $V_{cc}$ may be provided by an external source or by an on-chip regulator internal to the memory device, as is well known in the art.

The DRAM memory cell 12 includes an access transistor T and a data storage capacitor C. Activation of the word line W enables the access transistor T and connects the digit line D through the access transistor T to one node (the data storage node) of the capacitor C. The other node of the capacitor C is connected to a common cell plate shared by other storage capacitors of other DRAM memory cells (not shown) and is held at approximate potential $V_{cc}/2$. A "1" is stored in the memory cell 12 when the storage node of the capacitor C is charged to a voltage of $V_{cc}$ through the access transistor T. Similarly, a "0" is stored in the memory cell 12 when the storage node of the capacitor C is charged to a voltage of $V_{ss}$ (usually ground potential).

As is well known, the sense amp circuitry 16 typically includes an N-sense amp (not shown) which is activated by signal NSA and functions to pull which ever of the lines D and D* is at lower potential down to ground potential. Alternatively, the N-sense amp is always activated, and the isolation transistors 20 serve to control when the function of the N-sense amp is applied to the digit line pair D and D*. The sense amp circuitry 16 further includes a P-sense amp (not shown) which is activated by signal PSA* and functions to pull which ever of the lines D and D* is at higher potential up to supply potential $V_{cc}$.

FIG. 2 depicts a portion of a read-write cycle in a DRAM, whether in a memory device that is itself a DRAM or in the DRAM part of the prior art multiport DRAM device 10 of FIG. 1. Examples of a read-write cycle are the well known read-modify-write and late-write cycles. In a read-modify-write cycle, the data content of the DRAM cell 12 is transferred to external control and processing circuitry via the DRAM I/O path I/O, I/O*, and new data is transferred from the external control and processing circuitry to the DRAM cell 12 immediately thereafter. A late-write cycle differs from a read-modify-write cycle primarily in that data output buffers (not shown) are never enabled and the "read" data is not made available to the external circuitry. FIG. 2 depicts the situation in a read-write cycle in which the data to be written to the DRAM cell 12 is of the opposite state to that previously stored and read. The writing of opposite state data represents the worst case timing scenario, because of increased time necessary to develop signals and "flip" the digit lines D and D*.

Referring both to FIG. 1 and the timing diagram of FIG. 2, a DRAM read-write cycle will now be described. In response to a falling edge of a RAS* (row address strobe) signal produced by the external control circuitry (not shown), the equalization signal EQ first goes low and disengages the equalization circuitry 22 from the digit line pair D and D*. Subsequently, the word line W is activated and access is provided through transistor T to the data storage contents of capacitor C of the DRAM cell 12. As depicted in FIG. 2, the data contents in the DRAM cell was a "1", and hence the potential of digit line D rises slightly. The sense amp circuitry 16 is then activated by signals NSA and PSA*, and the potential of digit lines D and D* are pulled towards $V_{cc}$ and ground, respectively. In the event of a read-modify-write cycle, the column select transistors are turned on and the data is made available to the external processor via the DRAM I/O path I/O, I/O*. If, instead, the read-write cycle is a late-write cycle, data output buffers (not shown) remain disabled and the internally "read" data is not made available to the external control and processing circuitry.

A write signal pulse WRITE indicates that new data content is to be stored in the DRAM cell 12 from which data was just read. Data made available on the DRAM I/O path I/O, I/O* is transferred through the activated column select transistors 24 to the digit lines D and D*. When sufficient time has elapsed to ensure that the desired data value has been stored on the storage capacitor C of the DRAM cell 12, the word line W is shut down and the access transistor T is turned off, thereby disconnecting the digit line D from the data storage capacitor C. Subsequently, the sense amp 16 is disengaged and the equalization circuit 22 is once again engaged to equilibrate the paired digit lines D and D* to potential $V_{cc}/2$.

Alternatively, FIG. 2 depicts a write transfer operation from the SAM cell 14 to the DRAM cell 12. Instead of the WRITE pulse, a write transfer pulse TRAN activates transfer transistors 18 connecting the transfer digit line pair TD and TD* to the digit line pair D and D*, and data is transferred from the SAM cell to the DRAM cell. As depicted in FIG. 2, the data transferred from the SAM cell 14 is the opposite state of that previously stored in the DRAM cell 12, and data of value "0" is now written to the storage capacitor C of the DRAM cell. Only when sufficient time has elapsed to ensure that the desired data value has been stored on the storage capacitor C of the DRAM cell 12, can the word line W be shut down and the access transistor T turned off.

Crucial to proper timing of the above-described sequences, is accurately determining when the word line W can be shut down. A premature shut down of the word line W results in potentially inaccurate data storage values, whereas shutting down the word line too late wastes time that is precious in today's high speed data transfer operations. Prior art solutions to the timing problem have generally chosen the latter course—being certain of successful data storage but at the price of wasted time.

In typical DRAM design, timing decisions are made by sensing signal development in "model" circuits. Generally, direct sensing of the actual data storage and transfer circuits themselves is undesirable because of the resulting interference with circuit performance. The crudest model implemented to address the above-described timing problem is simply an RC circuit. More sophisticated models include modeled digit lines and word lines with model memory cells and model sense amps. Signals from these models are then input to one or more delay gates and/or logic gates, and the outputs of these gates are used to control system timing. However, current methods of model signal sensing and control are sufficiently imprecise that a continued time penalty has been paid to ensure correct data storage.

The problem left incompletely solved by the prior art has been described above in terms of a read-write cycle in a DRAM or a write transfer operation in a multiport DRAM in which the data state to be written is opposite to the data having been previously stored. Those versed in the art will appreciate that the same timing problem associated with accurately and precisely shutting down the word line in the above-described sequences also occurs in other data operations, including refresh cycles in a DRAM.

SUMMARY OF THE INVENTION

According to the present invention, a memory device includes a memory cell having an access device and a storage device. A word line is connected to the memory cell and enables or disables the access device depending on whether the word line is activated or deactivated. A digit line is connected to the memory cell and transfers data to and from the storage device when the access device is enabled. A timing control circuit includes a model circuit which simulates a transfer of data on the digit line to and from the memory cell. The model circuit provides a model output signal indicating the state of the modeled data transfer operation. The timing control circuit further includes a reference voltage circuit and a comparator. The reference voltage circuit provides a reference voltage which is compared to the model output signal by the comparator. The comparator produces a comparator output signal that is functionally related to the relative values of the model signal and the reference voltage. The timing control circuit is coupled to the word line and deactivates the word line, thereby disabling the memory cell access device, when the comparator output signal indicates that the modeled data transfer has progressed to a predetermined level.

According to the invention, a method of timing data transfer to the memory cell includes modeling the transfer of data on the digit line to and from the storage device. A model signal is then produced that is functionally related to the status of the modeled data transfer. The model signal is compared to a reference voltage to determine when the model signal bears a predetermined relationship with the reference voltage. The word line is then deactivated, thereby disabling the memory cell access device, when the modeled transfer of data has progressed to a predetermined extent.

DETAILED DESCRIPTION OF THE PREFERRED EMBODIMENT

Figure 3:
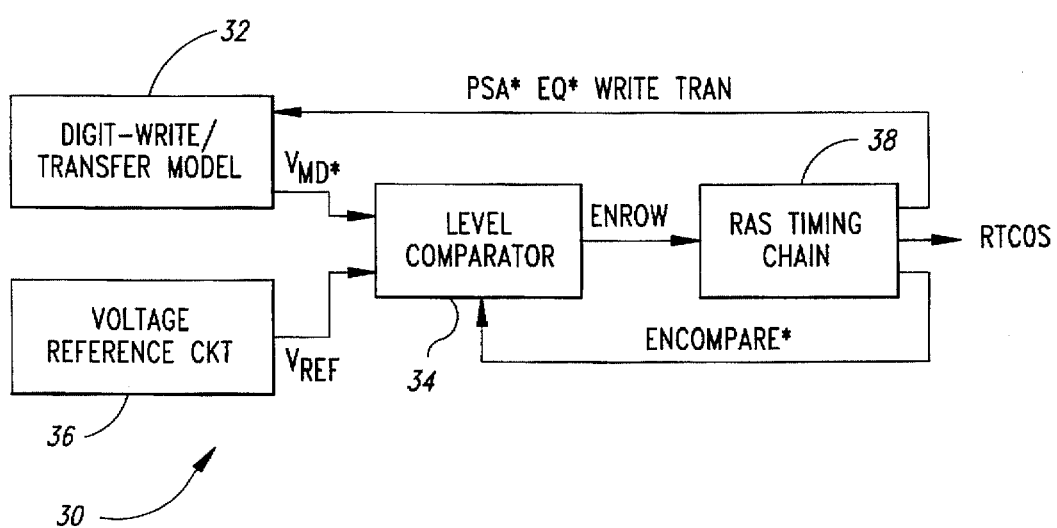
FIG. 3 is a block diagram of a timing control circuit according to the present invention.

Referring to FIG. 3, a block diagram depicts a timing control circuit 30 according to the present invention for use in a memory device such as, the above-described prior art multiport DRAM. The timing control circuit 30 accurately and precisely determines when a word line in the DRAM can be shut down after completion of a read-write or write transfer operation. The timing circuit 30 includes a digit-write/transfer model circuit 32 that provides a signal $V_{MD*}$ that is input to a level comparator circuit 34. The signal $V_{MD*}$ varies in time, as explained in detail below, and models the signal development on the complementary digit line D* in the above-described prior art multiport DRAM. The level comparator 34 compares the value of the signal $V_{MD*}$ to a reference voltage $V_{REF}$ and produces an output signal ENKOW functionally related to the relative values of signals $V_{MD*}$ and $V_{REF}$.

The reference voltage $V_{REF}$ is provided by a voltage reference circuit 36 which may be constructed from any of the well known integrated circuits for providing an adjustable and stable selected reference voltage. The level comparator 34 is enabled by a signal ENCOMPARE* provided by a RAS timing chain circuit 38 and in turn provides the signal ENROW to the RAS timing chain circuit. The RAS timing chain circuit 38 also provides a P-sense amp activation signal PSA*, a digit line pair equalization signal EQ*, a write signal WRITE, and a write transfer signal TRAN to the digit-write/transfer model circuit 32. The RAS timing chain circuit 38 produces a plurality of output signals RTCOS that control the operation of row enable and phase driver circuitry (not shown), as is well known in the art. The value of the signal ENROW provides to the RAS timing chain 38 information about when it is appropriate to shut down a word line following a write operation.

Figure 4:
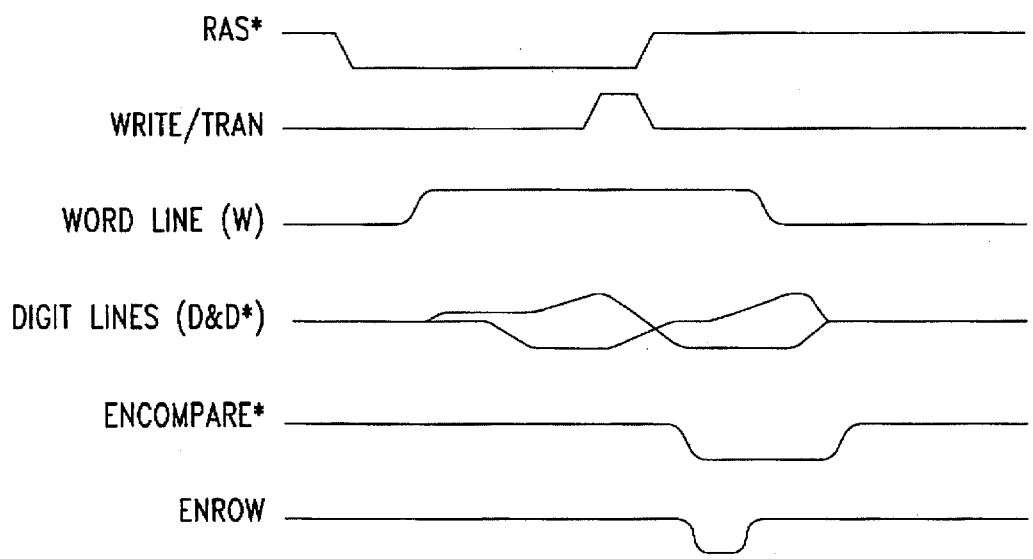
FIG. 4 is a timing diagram depicting a read-write or a write transfer operation in a multiport DRAM having the timing control circuit of FIG. 3.

FIG. 4 is a timing diagram depicting the operation of a DRAM having the timing circuit 30 of FIG. 3. As described above in connection with FIG. 2, a read-write or write transfer operation occurs in which the data to be written is of the opposite state to that previously stored and read. In response to the falling edge of RAS*, the word line W (see FIG. 1) is activated and signal development on the digit line pair D and D* begins. A write pulse WRITE (or alternatively a write transfer pulse TRAN) indicates that data is to be written to the DRAM cell 12. The signal ENCOMPARE* is triggered from the subsequent rising edge of RAS*, which in turn triggers the falling of signal ENROW. As long as ENROW stays low, the word line will not be deactivated. When the signal development on digit lines D and D* has developed sufficiently to ensure that correct data has been stored in the DRAM cell, the signal ENROW rises and the RAS timing chain circuitry 38 then shuts down the word line. The digit line pair D and D* is then equilibrated to the $V_{cc}/2$ state, and the signal ENCOMPARE* returns to the high idle state awaiting the next write operation.

Use of the timing control circuit 30 of FIG. 3 provides a number of advantages to the DRAM and computer system designer. Because the value of the reference voltage $V_{REF}$ is adjustable, the present invention provides great flexibility in selecting and determining operating specifications. As discussed in greater detail below, the timing control circuit can accurately and precisely track a model of the voltage level written to the storage capacitor C of the DRAM cell 12, shown in FIG. 1. Since the refresh frequency depends on the high level voltage stored on the capacitor C, the reference voltage $V_{REF}$ can be determined according to a selected value of the refresh frequency. Also, the high level voltage written to the capacitor C dictates the voltage that the word line W must provide to access the data content of the DRAM cell 12 through the access transistor T. Thus, the reference voltage $V_{REF}$ can be determined according to a selected value of the parameter commonly known as RAS precharge time ($t_{RP}$). Similarly, the reference voltage $V_{REF}$ can be determined according to a selected value of any other parameter that depends on the high level voltage written to the storage capacitor C of the DRAM cell 12.

Figure 5:
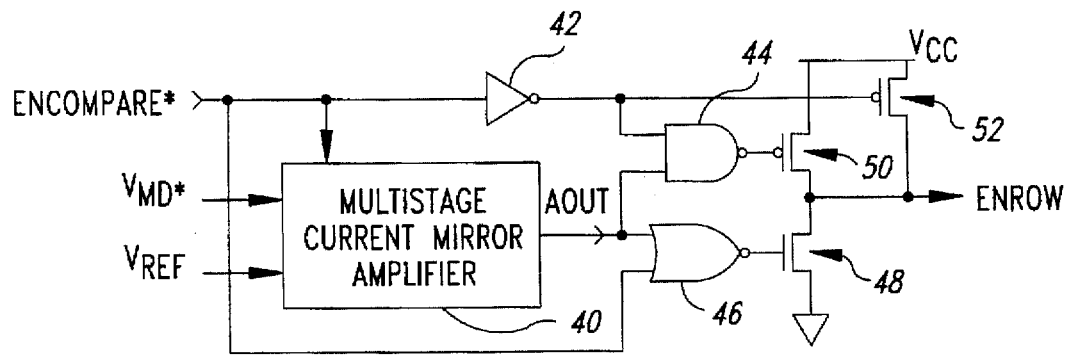
FIG. 5 is a part block, part schematic, and part logic diagram showing a level comparator circuit portion of the timing control circuit of FIG. 3.

FIG. 5 shows details of the level comparator circuit 34. A multistage current mirror differential amplifier 40 is enabled when the signal ENCOMPARE* is low and disabled when ENCOMPARE* is high. When enabled, the amplifier 40 compares the signal $V_{MD*}$ from the digit-write/transfer model 32 to the reference voltage $V_{REF}$ and produces an amplifier output signal AOUT that is functionally related to the relative values of $V_{MD*}$ and $V_{REF}$. A logic circuit structure—comprising an inverter 42, a NAND gate 44, a NOR gate 46, an n-channel transistor 48 and first and second p-channel transistors 50 and 52—receives the ENCOMPARE* and AOUT signals and produces the signal ENROW in response thereto. The differential amplifier 40 is preferably powered by a voltage in excess of the supply voltage $V_{cc}$. An on-chip pump voltage $V_{ccp}$ can be used for this purpose. Alternatively, the differential amplifier 40 can be powered by an external supply voltage $(V_{cc})_{ext}$ if the memory device includes an on-chip regulator providing a lower internal supply voltage $(V_{cc})_{int}$.

Consider now the situation when ENCOMPARE* is high. The amplifier 40 is disabled and AOUT is low. An inverter 42 inverts the ENCOMPARE* signal and provides a low input to the NAND gate 44, the other input of which (AOUT) is likewise low. The output of the NAND gate 44 is therefore high, and the p-channel transistor 50 is turned off. The NOR gate 46 has one high input (ENCOMPARE*) and one low input (AOUT), causing the output of the NOR gate to be low and the n-channel transistor 48 to be turned off. The low output signal of the inverter 42 turns on the p-channel transistor 52 which pulls the signal ENROW high. In summary, if ENCOMPARE* is high then ENROW is high.

Consider now the situation when ENCOMPARE* first transitions from the high to low state. The output of inverter 42 is high and the p-channel transistor 52 is turned off. The NAND gate 44 has one high signal (the inverted ENCOMPARE*) and one low signal (the signal AOUT not yet having changed from its initial low state). The output of the NAND gate is thus high, and the p-channel transistor 50 is turned off. The NOR gate 46 now has two low inputs, and thus provides a high output which turns on transistor 48 and pulls the signal ENROW low. In summary, immediately following the transition from high to low of signal ENCOMPARE*, the signal ENROW likewise transitions from high to low.

Consider now what occurs when the amplifier output signal AOUT transitions from low to high in response to the time varying input signal $V_{MD*}$ exceeding the reference voltage $V_{REF}$. The NOR gate 46 now has one high input (AOUT) and one low input (ENCOMPARE*), and thus produces a low output turning n-channel transistor 48 off. The NAND gate 44 has two high inputs (AOUT and the inverted ENCOMPARE*), and thus produces a low output turning p-channel transistor 50 on and pulling the signal ENROW high. In summary, as the output signal AOUT of the enabled amplifier 40 transitions from low to high, the signal ENROW transitions from low to high.

The use of an analog differential amplifier to compare the model signal $V_{MD*}$ with the reference voltage $V_{REF}$ affords numerous advantages over the prior art. One significant advantage is the well known increased accuracy and sensitivity of analog sensing as compared to digital sensing schemes. Another advantage is that digital sensing accuracy can be significantly affected by variations in the supply voltage $V_{cc}$. In contrast, the present invention employs a reference voltage circuit 36 (see FIG. 3) that provides a stable reference voltage which tracks well with typical variations in the supply voltage $V_{cc}$. Thus the operation and timing of the control circuit 30 of the present invention does not suffer from the effects on prior art control circuits associated with variations in supply voltage. Because the control circuit 30 according to the present invention is more precise, accurate and reliable than prior art circuits, a memory/computer system designer can provide for tighter operating specifications and thereby gain improved performance and speed.

Figure 6:
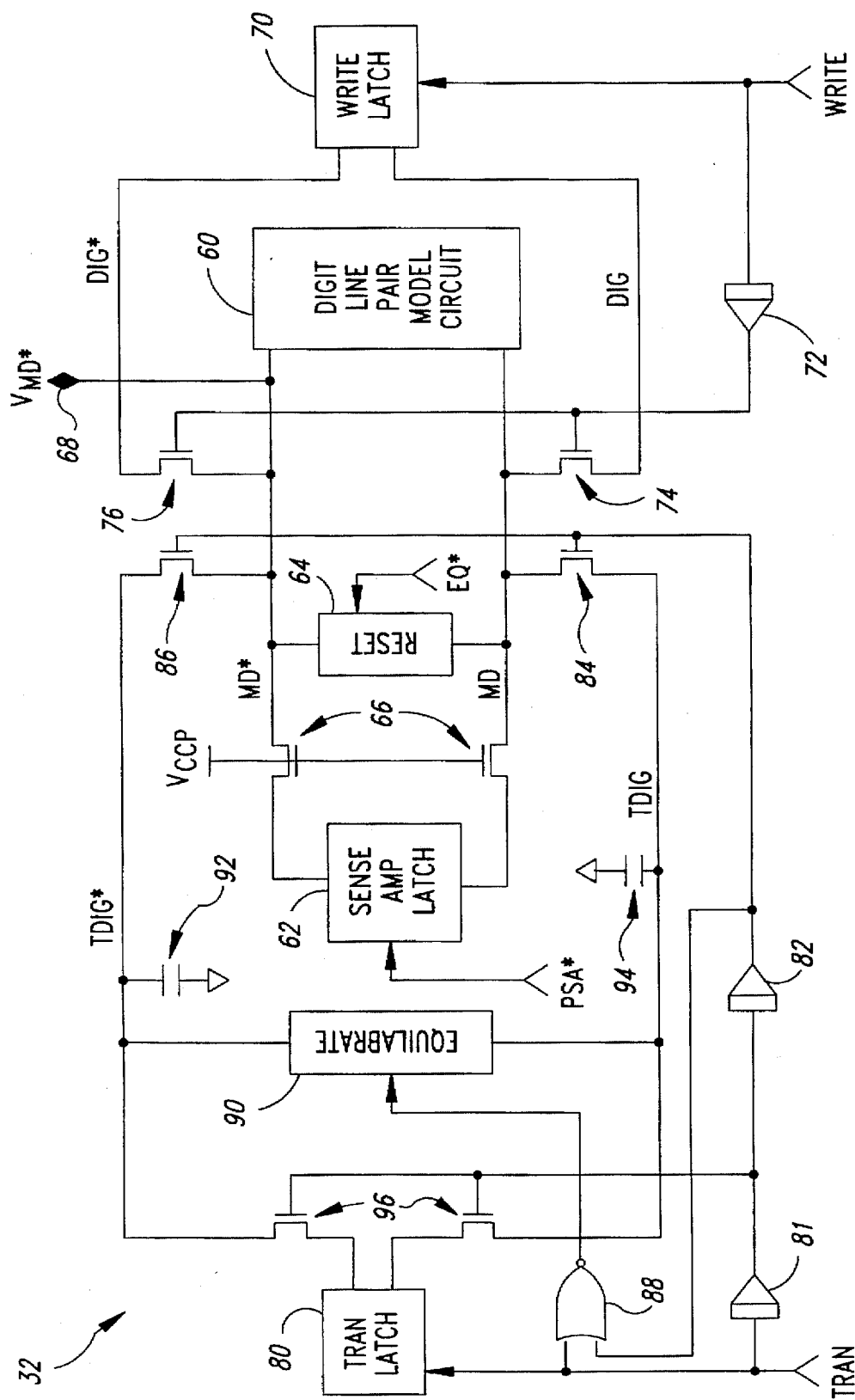
FIG. 6 is a part block, part schematic, and part logic diagram showing a digit-write/transfer model circuit portion of the timing control circuit of FIG. 3.

Referring to FIG. 6, details of the digit-write/transfer model circuit 32 are now described. The central element of the digit-write/transfer model circuit 32 is a digit line pair model circuit 60. The digit line pair model circuit 60 models capacitive effects of digit lines and memory cells, including both the self capacitance of digit lines and the mutual capacitance between digit lines and between digit and word lines. Circuits such as digit line pair model circuit 60 are conventionally used and will not be described in detail herein. For example, the present invention is as readily adaptable to a four-input twisted digit line model as to the two-input model depicted in FIG. 6. The digit line pair model circuit 60 is connected to digit line MD, and to complementary digit line MD*. The signal state $V_{MD*}$ of line MD* is monitored at I/O node 68.

Figure 1:
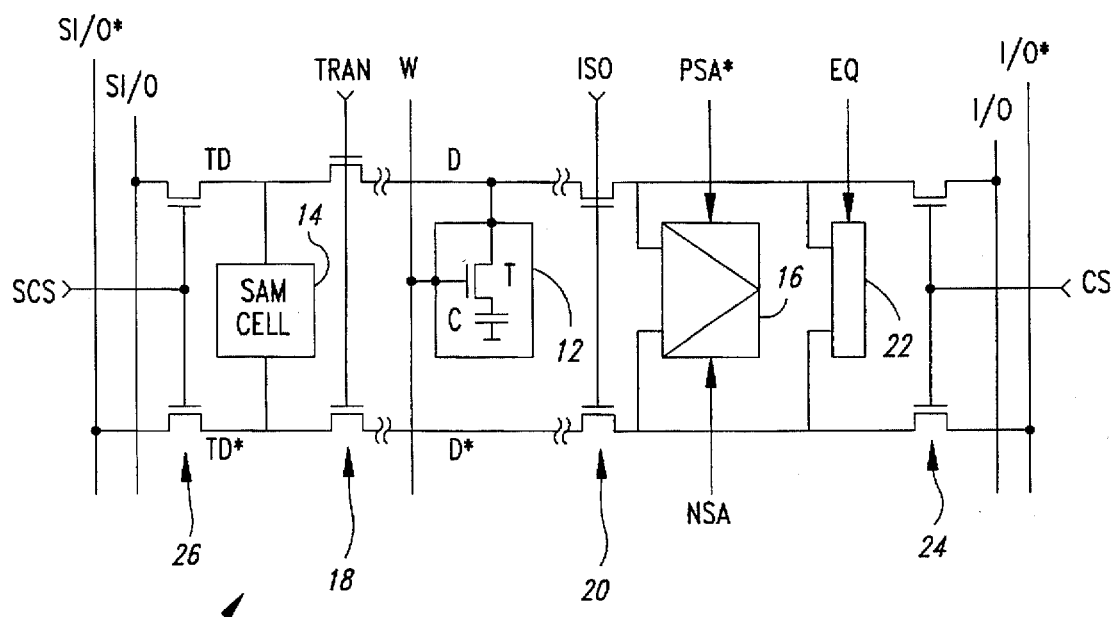
FIG. 1 is a part block, part electric schematic diagram of a portion of a typical prior art multiport DRAM.
Figure 2:
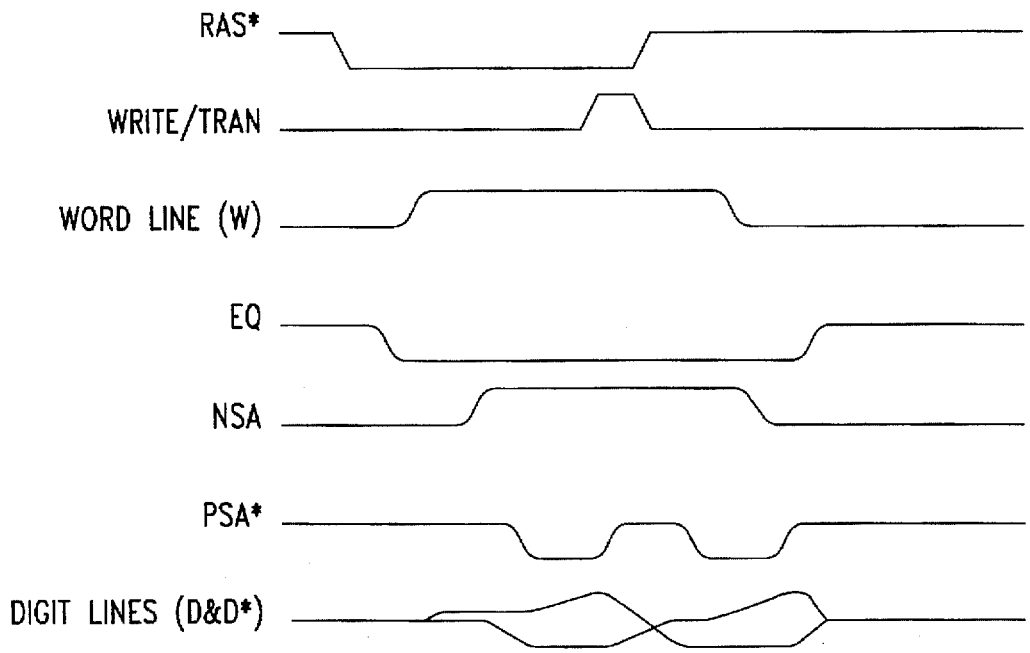
FIG. 2 is a timing diagram depicting a read-write or a write transfer operation in the prior art multiport DRAM of FIG. 1.

A sense amp latch circuit 62, serves to model the sense amp circuitry 16 of FIG. 1 and to latch onto the states of the digit line inputs MD, MD*. The sense amp latch circuit 62 is conveniently and preferably enabled by the signal PSA* described above in connection with FIGS. 1 and 2. Transistors 66 each have a gate potential $V_{ccp}$ in excess of supply voltage $V_{cc}$, and serve to model the isolation transistors 20 of FIG. 1. A reset circuit 64 provides an initial high state to line MD and an initial low state to line MD*. The reset circuit 64 is conveniently and preferably enabled by the signal EQ*, complementary to the signal EQ described above in connection with FIGS. 1 and 2.

The modeling of a read-write cycle in a DRAM will now be described in which the data to be written to the DRAM cell 12 (see FIG. 1) is of the opposite state to that previously stored and read. The reset circuit 64 has placed the MD line connected to the digit line pair model 60 in the high state, and the line MD* in the low state. The WRITE pulse (see FIG. 4 and accompanying discussion) sets a write latch 70 which places lines DIG and DIG* in low and high states, respectively. A delay gate 72 then provides a delayed write pulse which turns on transistor 74 which connects the line DIG to line MD. Transistor 76 is also turned on and connects the line DIG* to line MD*. The write latch 70, having placed line DIG* in a high state, now "flips" the state of line MD* to which line DIG* is connected. The "flip" requires time, however, and the signal state $V_{MD*}$ of line MD* is sampled at the I/O node 68 and provided to the level comparator 34 of FIGS. 3 and 5.

The modeling of a write transfer in a multiport DRAM will now be described in which the data to be transferred and written to the DRAM cell 12 (see FIG. 1) is of the opposite state to that previously stored and read. The reset circuit 64 has placed the MD line in a high state and the MD* line in a low state. Prior to the TRAN pulse (see FIG. 4 and accompanying discussion), a NOR gate 88 provides a signal enabling an equilibrate circuit 90 which sets lines TDIG and TDIG* at potential $V_{cc}/2$. One or more capacitors 92 are connected between line TDIG* and ground, and serve to model the capacitance of complementary transfer digit line .TD* of FIG. 1. Similarly, one or more capacitors 94 are connected between line TDIG and ground, and serve to model the capacitance of transfer digit line TD of FIG. 1.

The TRAN pulse sets a transfer latch 80 and, following a delay produced by delay gate 81 which turns on transistors 96, places lines TDIG and TDIG* in low and high states, respectively. The TRAN pulse also causes the NOR gate 88 to provide a signal disabling the equilibrate circuit 90. A delay gate 82 provides a delayed transfer pulse which turns on transistor 84 which connects the line TDIG to line MD. Transistor 86 is also turned on and connects the line TDIG* to line MD*. The transfer latch 80, having placed line TDIG* in a high state, now "flips" the state of line MD* to which TDIG* is connected. The "flip" requires time, however, and the signal state $V_{MD*}$ of line MD* is sampled at the I/O node 68 and provided to the level comparator 34 of FIGS. 3 and 5. After the TRAN pulse, and following associated time delays, transistors 84, 86 and 96, are turned off (decoupling lines TDIG, TDIG* from MD, MD*) and the NOR gate 88 provides a signal enabling the equilibrate circuit 90.

Figure 7:
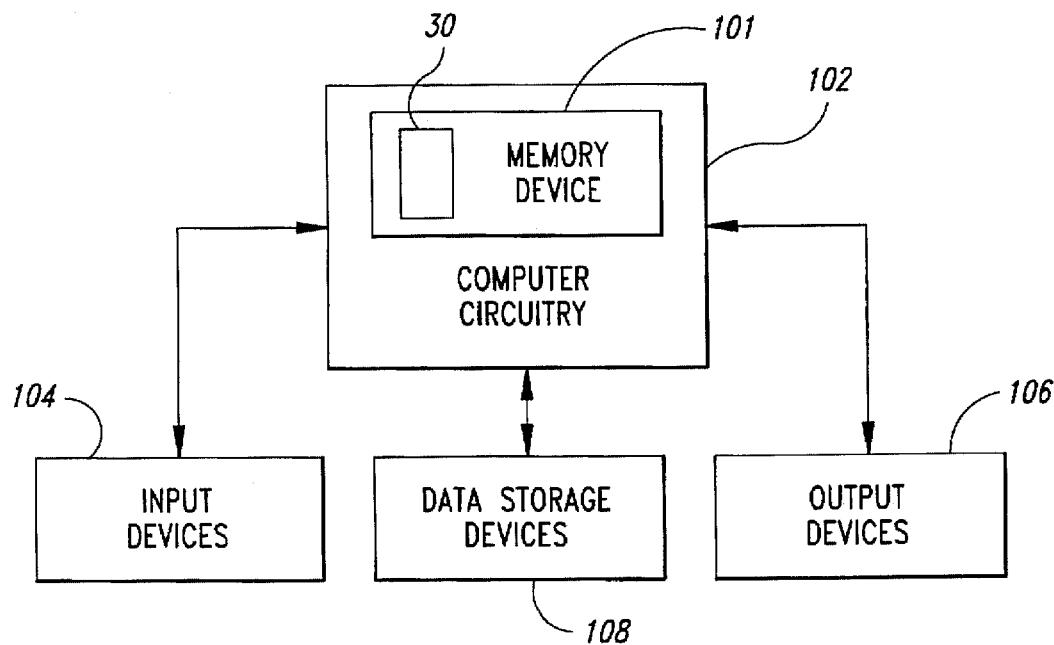
FIG. 7 is a block diagram of a computer system according to the present invention.

FIG. 7 is a block diagram of a computer system 100 that uses a memory device 101 having the timing control circuit 30 according to the present invention. The computer system 100 includes computer circuitry 102 for performing such computer functions as executing software to perform desired calculations and tasks. Circuitry 102 typically contains a processor (not shown) and the memory device 101 as shown. One or more input devices 104, such as a keyboard or a pointing device, is coupled to the computer circuitry 102 and allows an operator (not shown) to manually input data thereto. One or more output devices 106 is coupled to the computer circuitry 102 to provide to the operator data generated by the circuitry. Examples of output devices 106 include a printer and a video display unit. One or more data storage devices 108 is coupled to the computer circuitry 102 to store data on or retrieve data from external storage media (not shown). Examples of storage devices 108 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. For example, the timing control circuit according to the present invention was described above as applicable to a worst case scenario of a read-write or write transfer sequence in which the data to be written is of the opposite state to that having previously been stored and read. Those versed in the art will appreciate that the present invention is equally applicable to other data transfer operations and data state values. Also, while the timing control circuit according to the present invention has been described for use with a DRAM or multiport DRAM, the present invention could be advantageously applied to other memory devices in which accurate and precise timing of data transfer operations is important. Accordingly, the invention is not limited except as by the appended claims.

I claim:

1. A memory device, comprising:

a memory cell for storing data, said memory cell having an access device and a storage device;

a word line connected to said memory cell, the access device being enabled when said word line is activated and disabled when said word line is deactivated;

a digit line connected to said memory cell and operable to transfer data to and from the storage device when the access device is enabled; and a control circuit coupled to said word line and operable to deactivate said word line, said control circuit including:

a model circuit simulating the transfer of data on said digit line to and from the storage device and providing a model signal that indicates the state of the simulated transfer of data;

a reference voltage circuit providing a stable reference voltage; and a comparator connected to the model circuit to receive the model signal, the comparator further connected to the reference voltage circuit to receive the reference voltage, the comparator producing an output signal functionally related to the relative values of the model signal and the reference voltage, said control circuit deactivating said word line when the model signal bears a predetermined relationship to the reference voltage.

2. The memory device of claim 1 wherein the comparator includes an analog amplifier circuit receiving the reference voltage and the model signal, the analog amplifier circuit producing an output signal that is an amplification of the voltage difference between the model signal and the reference voltage.

3. The memory device of claim 1 wherein the model circuit includes a serial transfer digit line model that models transfer of data from a serial access memory cell to said digit line and said memory cell connected thereto.

4. The memory device of claim 1 wherein the model circuit simulates a read-write cycle.

5. The memory device of claim 1 wherein the model circuit simulates a write transfer operation.

6. The memory device of claim 1 wherein the reference voltage circuit is adjustable to allow selection of a stable reference voltage value corresponding to a selected parameter, the parameter value being dependent on a high voltage level of the storage device of said memory cell.

7. A computer system, comprising:

a data input device;

a data output device; and computer circuitry coupled to said data input device and said data output device and including a memory device having:

a memory cell for storing data, the memory cell having an access device and a storage device;

a word line connected to the memory cell, the access device being enabled when the word line is activated and disabled when the word line is deactivated;

a digit line connected to the memory cell and operable to transfer data to and from the storage device when the access device is enabled;

a model circuit simulating the transfer of data on the digit line to and from the storage device and providing a model signal that indicates the state of the simulated transfer of data;

a reference voltage circuit providing a stable reference voltage; and a comparator connected to the model circuit to receive the model signal, the comparator further connected to the reference voltage circuit to receive the reference voltage, the comparator producing an output signal functionally related to the relative values of the model signal and the reference voltage, the comparator coupled to the word line and operable to deactivate the word line when the model signal bears a predetermined relationship to the reference voltage.

8. A method of timing data transfer to a memory cell having an access device and a storage device, the access device being enabled by an activated word line, and the storage device being connected to a digit line when the access device is enabled, comprising the steps of:

modeling the transfer of data on the digit line to and from the storage device;

producing a model signal that is functionally related to the status of the modeled transfer of data;

producing a reference voltage;

comparing the model signal to the reference voltage and determining when the model signal bears a predetermined relationship to the reference voltage; and deactivating the word line, thereby disabling the access device of the memory cell, when the modeled transfer of data has progressed to a predetermined extent.

9. The method of claim 8 wherein the step of comparing the model signal to the reference voltage includes the step of amplifying a relative magnitude difference of the model signal and the reference voltage.

10. The method of claim 8 wherein the step of modeling the transfer of data on the digit line to and from the storage device includes the step of modeling a serial transfer digit line.

11. The method of claim 8 further comprising the steps of:

selecting a refresh frequency; and adjusting the reference voltage to a value corresponding with the selected refresh frequency.

12. The method of claim 8 further comprising the steps of:

selecting a row precharge time period; and adjusting the reference voltage to a value corresponding with the selected row precharge time period.

13. The method of claim 8 further comprising the steps of:

selecting a value of a parameter, the parameter value depending on a high level voltage stored in the storage device of the memory cell; and adjusting the reference voltage to a value corresponding with the selected parameter value.

* * * * *